(12) United States Patent
Chou et al.

(10) Patent No.: US 9,502,748 B2
(45) Date of Patent: Nov. 22, 2016

(54) HOLDER FOR ANTENNA TESTING

(71) Applicant: AUDEN TECHNO CORP., Taoyuan County (TW)

(72) Inventors: Hsin-Hung Chou, Taoyuan County (TW); Ming-Chieh Hu, Taoyuan County (TW)

(73) Assignee: AUDEN TECHNO CORP., Taoyuan County (TW)

( * ) Notice: Subject to any disclaimer, the term of this patent is extended or adjusted under 35 U.S.C. 154(b) by 265 days.

(21) Appl. No.: 14/335,211

(22) Filed: Jul. 18, 2014

(65) Prior Publication Data

US 2016/0018438 A1    Jan. 21, 2016

(51) Int. Cl.
*G01R 31/02*    (2006.01)
*H01Q 1/12*    (2006.01)
*G01R 29/10*    (2006.01)

(52) U.S. Cl.
CPC ............ *H01Q 1/1235* (2013.01); *G01R 29/10* (2013.01)

(58) Field of Classification Search
CPC    G01R 29/0821; G01R 29/105; G01R 29/10; G01R 1/04; H04B 17/15; H04B 17/29; H04B 17/0085; H04B 17/102; H04B 17/12; H04B 17/14; H04B 17/24; H04B 17/26; H04B 17/309; H04B 17/3912; H04B 7/02; H04B 7/2662
USPC .......................... 324/555, 627, 628; 343/703
See application file for complete search history.

(56) References Cited

U.S. PATENT DOCUMENTS

2011/0102276 A1*    5/2011    Jimenez ................. G01R 29/10
343/703

* cited by examiner

*Primary Examiner* — Vincent Q Nguyen
(74) *Attorney, Agent, or Firm* — Li & Cai Intellectual Property (USA) Office (57) ABSTRACT

A holder for antenna testing includes a track base, an antenna carrying device, and at least one displacement-measuring member. The track base has a track platform and a track module disposed on the track platform. A longitudinal direction of the track module defines a displacing direction. The antenna carrying device is movably disposed on the track module along the displacing direction. The displacement-measuring member is movably disposed on the track platform along the displacing direction and is arranged outside the track module. The displacement-measuring member has a zero point and a distance scale counting from the zero point along the displacing direction. The displacement-measuring member is adjustable to align the zero point to the antenna carrying device.

7 Claims, 11 Drawing Sheets

HOLDER FOR ANTENNA TESTING

BACKGROUND OF THE DISCLOSURE

1. Field of the Disclosure

The instant disclosure relates to a holder; more particular, to a holder for antenna testing.

2. Description of Related Art

When testing a specific absorption rate (SAR) of an antenna, the antenna needs to be disposed on a holder for setting parameters (e.g., the angle of the antenna, the height of the antenna, the distance between the antenna and the testing source). However, the conventional holder only has clamping function, such that the conventional holder can't be used to set the parameters quickly, which reduces the antenna testing time.

To achieve the abovementioned improvement, the inventors strive through industrial experience and academic research to present the instant disclosure, which can provide additional improvement as mentioned above.

SUMMARY OF THE DISCLOSURE

One embodiment of the instant disclosure provides a holder for antenna testing, and the holder can effectively reduce the antenna testing time.

The holder for antenna testing, comprises: a track base having a track platform and a track module disposed on the track platform, wherein a longitudinal direction of the track module defines a displacing direction; an antenna carrying device movably is disposed on the track module along the displacing direction, wherein the antenna carrying device is movable with respect to the track module from a first position to a second position along the displacing direction; and at least one displacement-measuring member movably is disposed on the track platform along the displacing direction and is arranged outside the track module, wherein the displacement-measuring member has a zero point and a distance scale counting from the zero point along the displacing direction, the displacement-measuring member is adjustable to align with the zero point to the antenna carrying device; wherein when the antenna carrying device moves from the first position to the second position, the distance scale displays a moving distance of the antenna carrying device with respect to the track base by aligning the zero point of the displacement-measuring member with the antenna carrying device arranged at the first position; the displacement-measuring member is adjustable to align the zero point to the antenna carrying device arranged at the second position after the moving distance is displayed.

Based on the above, the holder has the movable displacement-measuring member that can adjust and align the zero point with the antenna carrying device before the antenna carrying device is moved, thus when moving the antenna carrying device, the distance scale can immediately show or display a moving distance of the antenna carrying device with respect to the track base for achieving quick and precise measurement and to reduce the testing time of the antenna.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
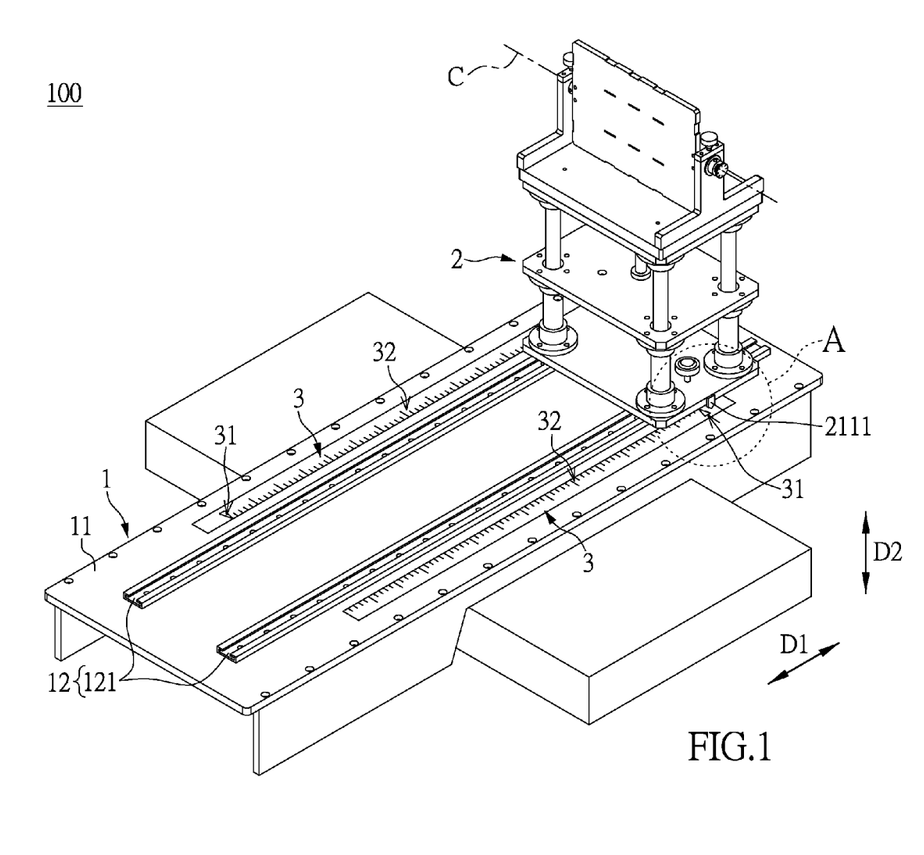
FIG. 1 is a perspective view showing a holder for antenna testing according to the instant disclosure.
Figure 2:
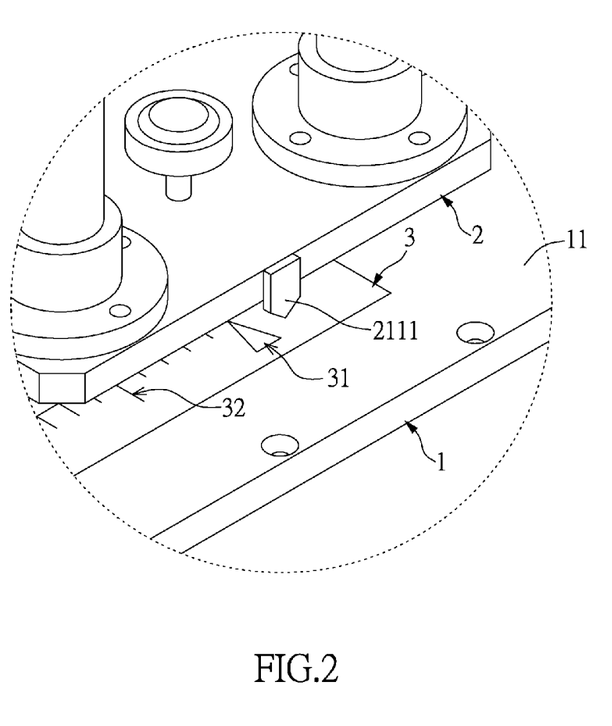
FIG. 2 is an enlarge view of FIG. 1.

Please refer to FIGS. 1 and 2, which show an embodiment of the instant disclosure. References are hereunder made to the detailed descriptions and appended drawings in connection with the instant disclosure. However, the appended drawings are merely shown for exemplary purposes, rather than being used to restrict the scope of the instant disclosure.

Figure 8:
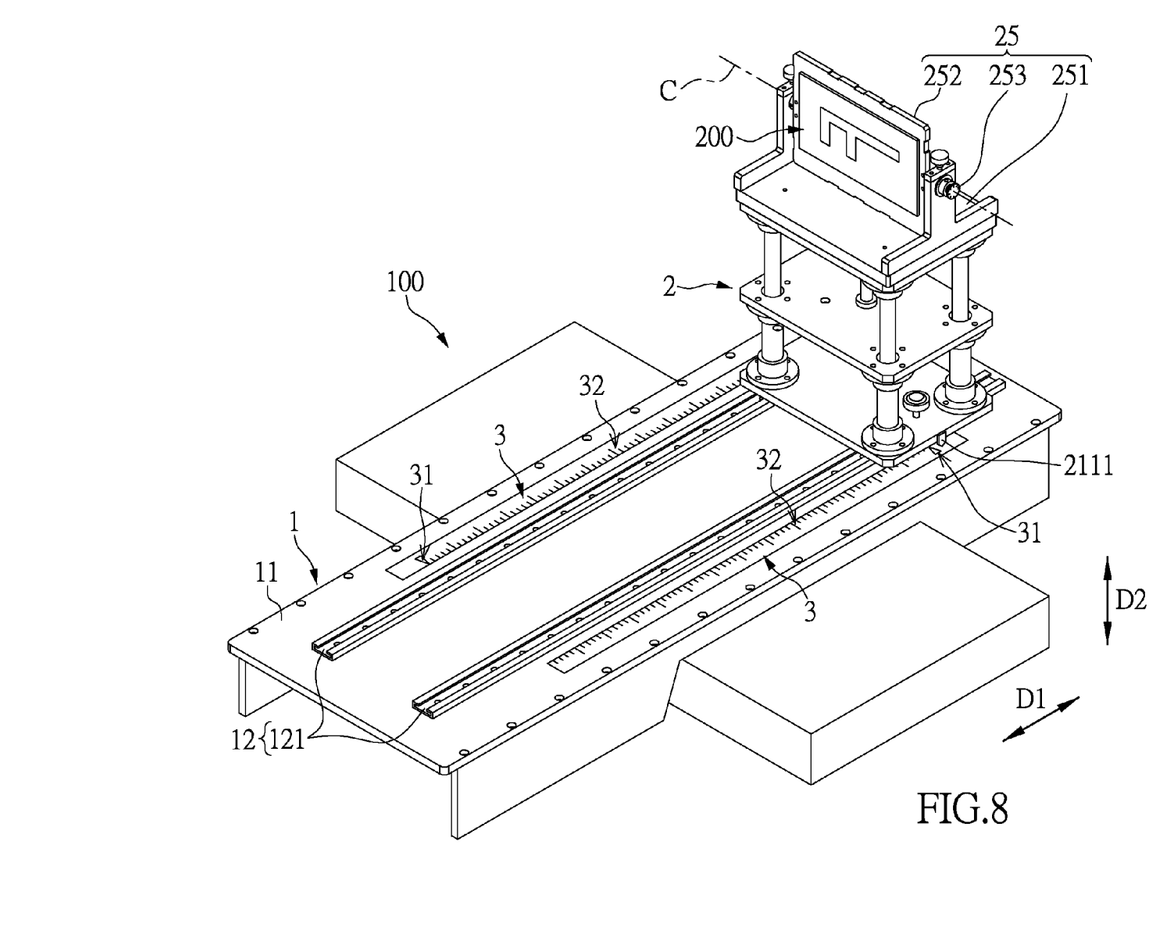
FIG. 8 is a perspective view showing the holder mounting an untested antenna when the holder is at a first position.

The instant embodiment provides a holder 100 for antenna testing. Specifically, the holder 100 is provided to mount an untested antenna 200 (as shown in FIG. 8), thereby quickly adjusting the parameters of the untested antenna 200 (i.e., an angle of the untested antenna 200, a height of the untested antenna 200, or a distance between the untested antenna 200 and the testing source) and the holder 100 can obtain the relative testing data of the untested antenna 200. The holder 100 is preferably provided for testing SAR of the untested antenna 200, but the holder 100 of the instant embodiment is not limited thereto.

The holder 100 includes a track base 1, an antenna carrying device 2, and a displacement-measuring member 3. The antenna carrying device 2 and the displacement-measuring member 3 are respectively and movably disposed on the track base 1, and a moving distance of the antenna carrying device 2 with respect to the track base 1 can be obtained quickly and precisely by the movable displacement-measuring member 3. The following description discloses the constructions of the track base 1, the antenna carrying device 2, and the displacement-measuring member 3. The relationship between the above components and the operating manner of the holder 100 is disclosed further below. The track base 1 has an elongated track platform 11 and a track module 12 fixed on the track platform 11. The track module 12 has two elongated rails 121. The rails 121 having the same length are arranged on the track platform 11 and are substantially parallel to each other. The longitudinal direction of each rail 121 is defined as a displacing direction D1, and the displacing direction D1 in the instant embodiment is substantially parallel to the longitudinal direction of the track base 1.

Figure 9:
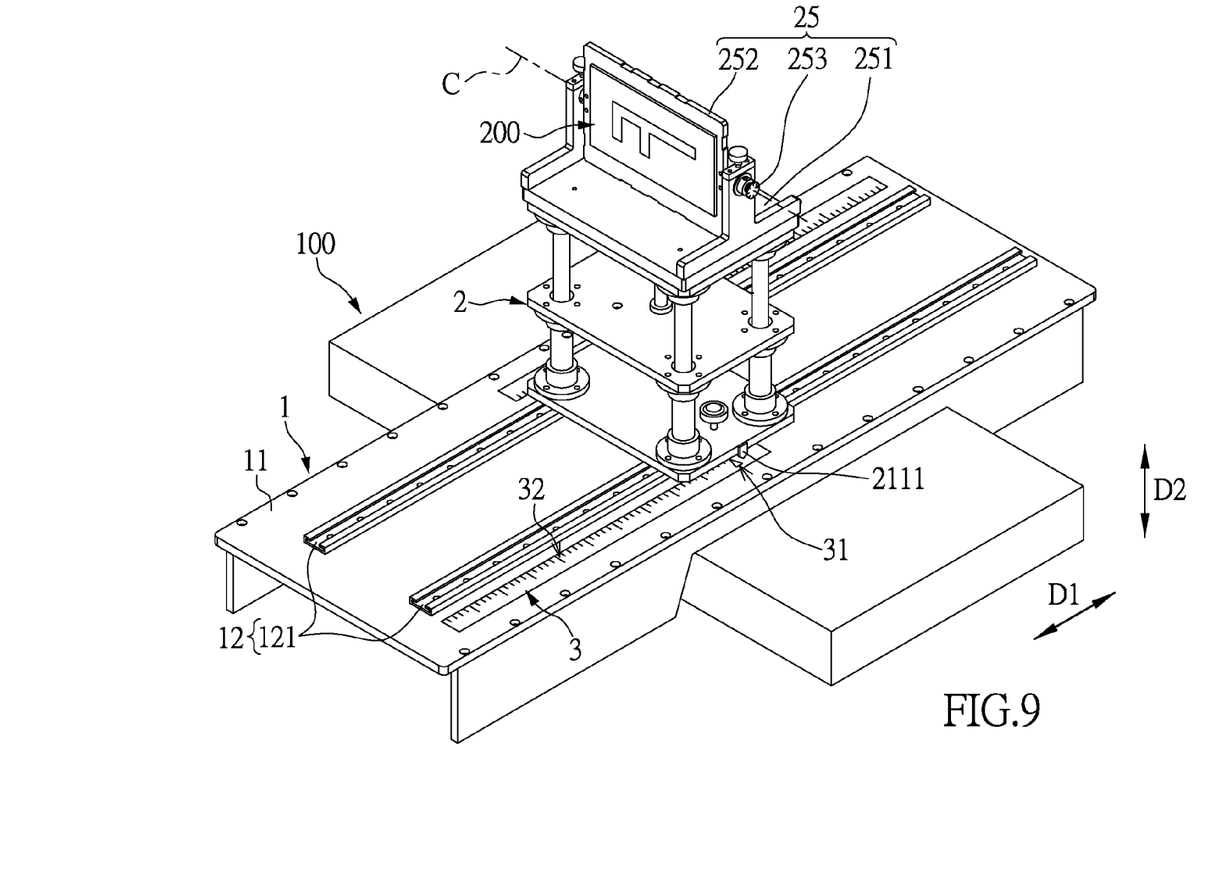
FIG. 9 is a perspective view showing the holder mounting the untested antenna when the holder is at a second position.

The antenna carrying device 2 is movably disposed on the rails 121 of the track module 12 along the displacing direction D1, and the antenna carrying device 2 is movable with respect to the rails 121 from a first position (as shown in FIG. 8) to a second position (as shown in FIG. 9) along the displacing direction D1. The first position and the second position are variable according to the user's demands, that is to say, the first position or the second position can be any position of the track module 12, and is not limited to the position as shown in the figures.

Please refer to FIG. 3 through FIG. 6. The antenna carrying device 2 has a bottom seat 21, a carrying plate 22, a height-measuring element 23, a scale indicator 24, and an angle-adjusting seat 25. The height-measuring element 23 is fixed on the bottom of the carrying plate 22, and the angle-adjusting seat 25 is detachably disposed on the top of the carrying plate 22. The carrying plate 22 is movably disposed on the bottom seat 21 along a lifting direction D2, thus the carrying plate 22, the height-measuring element 23, and angle-adjusting seat 25 can move along the lifting direction D2 with respect to the bottom seat 21 to a predetermined height. The lifting direction D2 in the instant embodiment is perpendicular to the track platform 11 and is perpendicular to the displacing direction D1.

Specifically, the bottom seat 21 has a lower plate 211, an upper plate 212, a plurality of retractable units 213, and a height-adjusting shaft 214. The lower plate 211 and the upper plate 212 are substantially rectangular plates having the same dimensions. The long edge of the lower plate 211 is longer than the distance between the rails 121. At least one sliding block (not shown) conforming to the rails 121 can be fixed on the bottom surface of the lower plate 211, thus the lower plate 211 can be movably disposed on the track module 12 along the displacing direction D1 by the cooperation of the rails 121 and the sliding block. The lower plate 211 has a scale indicator 2111 disposed on the short edge thereof parallel to the displacing direction D1.

Moreover, number of the retractable unit 213 in the instant embodiment is four, and each corner of the lower plate 211 and the corresponding corner of the upper plate 212 are provided with one retractable unit 213 connected therebetween. Each retractable unit 213 has a hollow supporting shaft 2131 and an extendable shaft 2132 at least partially coupling through the supporting shaft 2131. Two ends of each supporting shaft 2131 are respectively fixed on one corner of the lower plate 211 and the adjacent corner of the upper plate 212, thus the corners of the lower plate 211 and the upper plates are fixed respectively by the four supporting shafts 2131. The top end portion of each extendable shaft 2132 passing through the upper plate 212 is fixed on the carrying plate 22, and the extendable shaft 2132 is movable along the lifting direction D2 with respect to the corresponding supporting shaft 2131.

Specifically, the height-adjusting shaft 214 in the instant embodiment takes an elongated screw for example, and one end of the height-adjusting shaft 214 is fixed on the carrying plate 22, another end of the height-adjusting shaft 214 is arranged between the lower plate 211 and the upper plate 212. A portion of the height-adjusting shaft 214, which is arranged between the two ends of the height-adjusting shaft 214, couples through and screws to the upper plate 212. Thus, when spinning the height-adjusting shaft 214, the carrying plate 22 moves along the lifting direction D2 with respect to the upper plate 212 (as shown in FIGS. 4 and 5).

Figure 4:
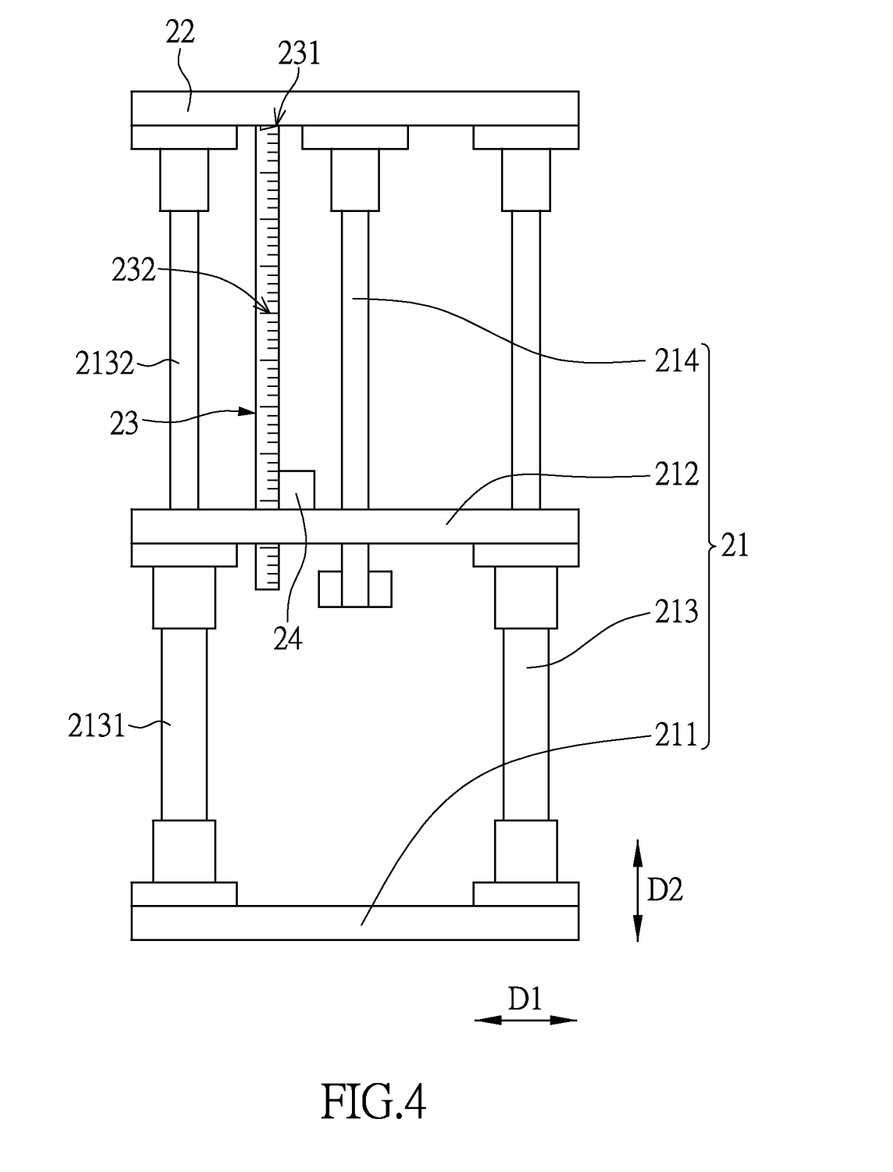
FIG. 4 is a side view showing a stretching position of an antenna carrying device (not showing an angle-adjusting seat)
Figure 5:
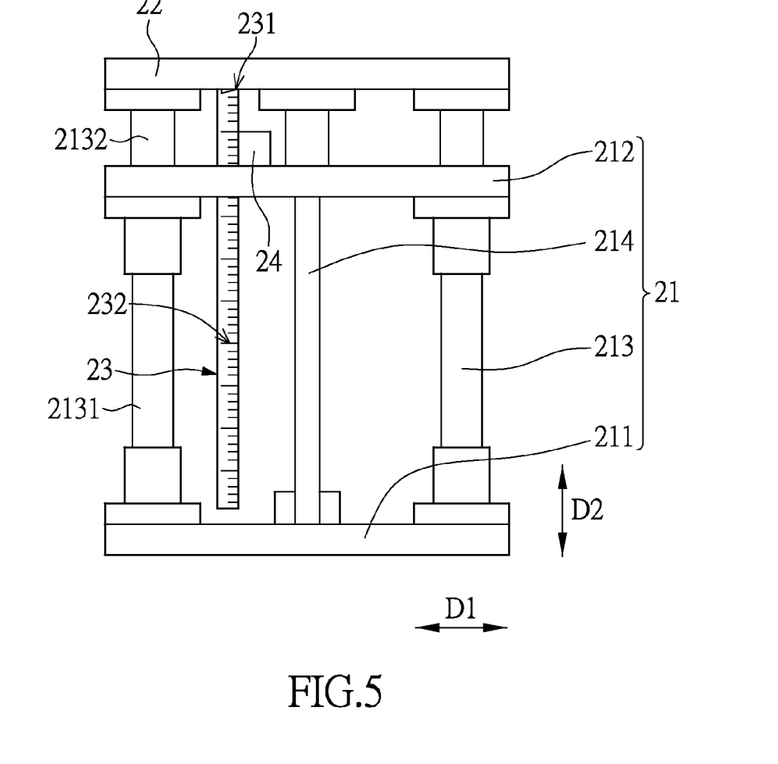
FIG. 5 is a side view showing a retracting position of the antenna carrying device (not showing the angle-adjusting seat)
Figure 6:
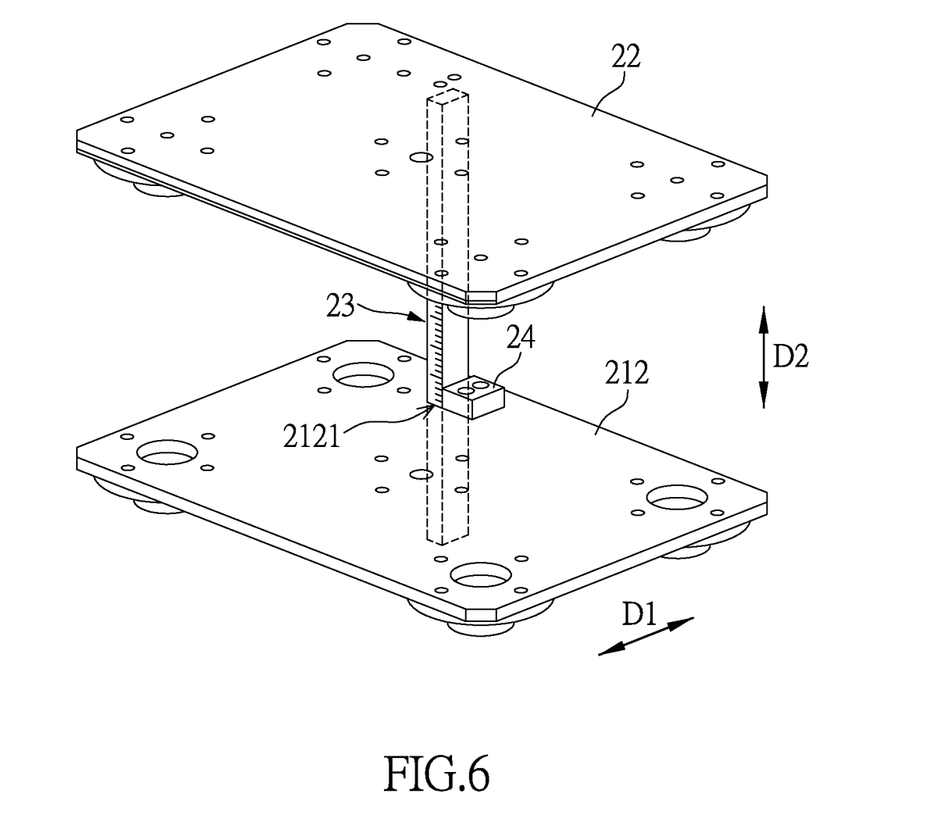
FIG. 6 is a perspective view showing part of the antenna carrying device.

The height-measuring element 23 in the instant embodiment takes an elongated ruler for example, and one end of the height-measuring element 23 (i.e., the top end of the height-measuring element 23 as shown in FIG. 4) is fixed on the carrying plate 22 and is parallel to the lifting direction D2. Thus, when the carrying plate 22 moves along the lifting direction D2 with respect to the bottom seat 21, the height-measuring element 23 shows a height of the carrying plate 22 with respect to the bottom seat 21 immediately.

Specifically, the height-measuring element 23 has a zero point 231 and a distance scale 232 counting from the zero point 231 along the lifting direction D2. The zero point 231 of the height-measuring element 23 is aligned and fixed at the bottom surface of the carrying plate 22, and the height-measuring element 23 is arranged in a region defined between the carrying plate 22 and the orthogonal projection of the carrying plate 22 towards the track base 1, that is to say, the height-measuring element 23 is arranged between the carrying plate 22 and the track base 1. Moreover, the upper plate 212 of the bottom seat 21 has a thru-hole 2121 arranged in a moving path of the height-measuring element 23, and the height-measuring element 23 move through the thru-hole 2121 of the bottom seat 21.

The scale indicator 24 is fixed on the top surface of the upper plate 212 of the bottom seat 21. The scale indicator 24 is arranged adjacent to the moving path of the height-measuring element 23, that is to say, the scale indicator 24 is arranged adjacent to the thru-hole 2121 of the upper plate 212. Thus, the scale indicator 24 aligns with a point on the distance scale 232 of the height-measuring element 23, and the point on the distance scale 232 of the height-measuring element 23 shows the lifting distance of the carrying plate 22 with respect to the bottom base 32 immediately.

Figure 3:
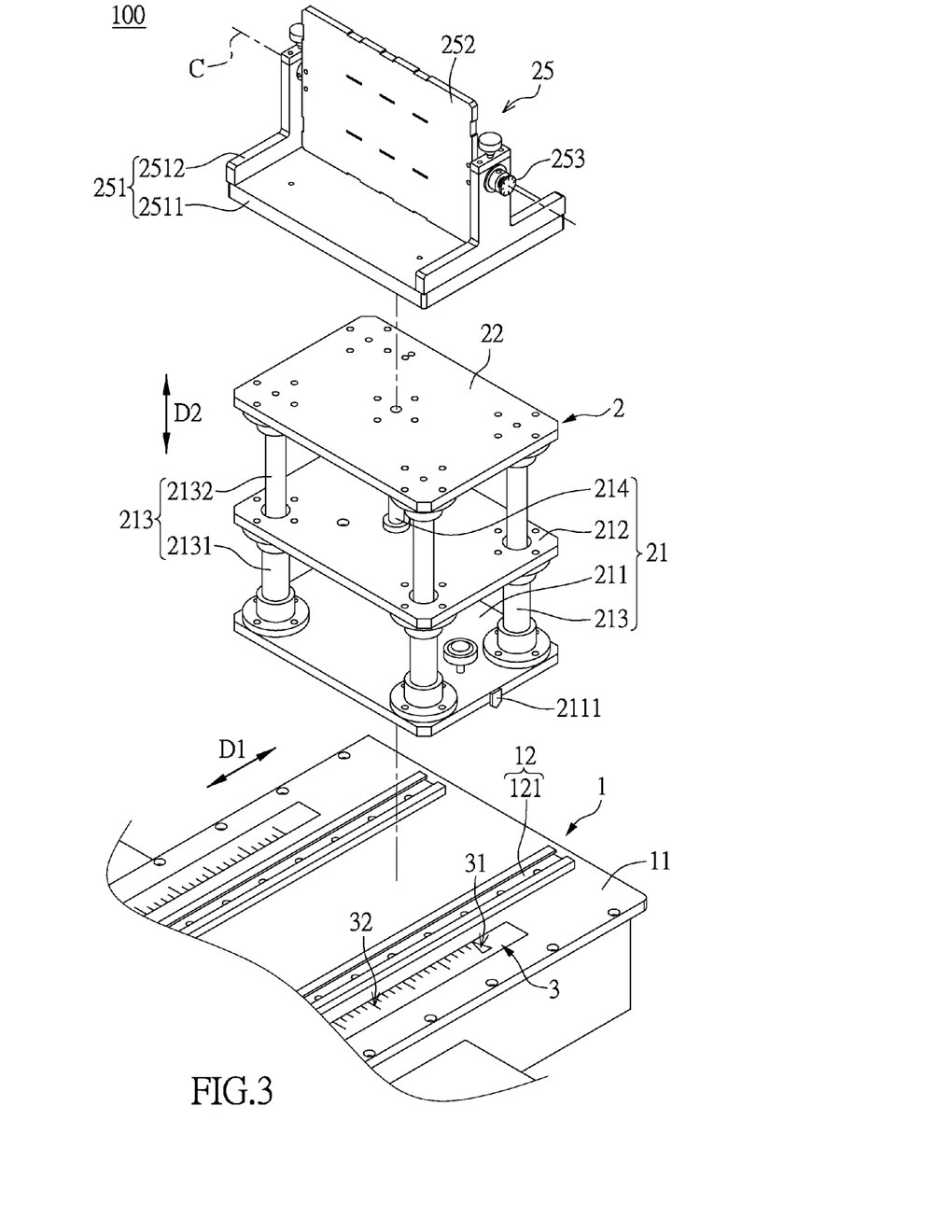
FIG. 3 is an exploded view of FIG. 1.
Figure 7:
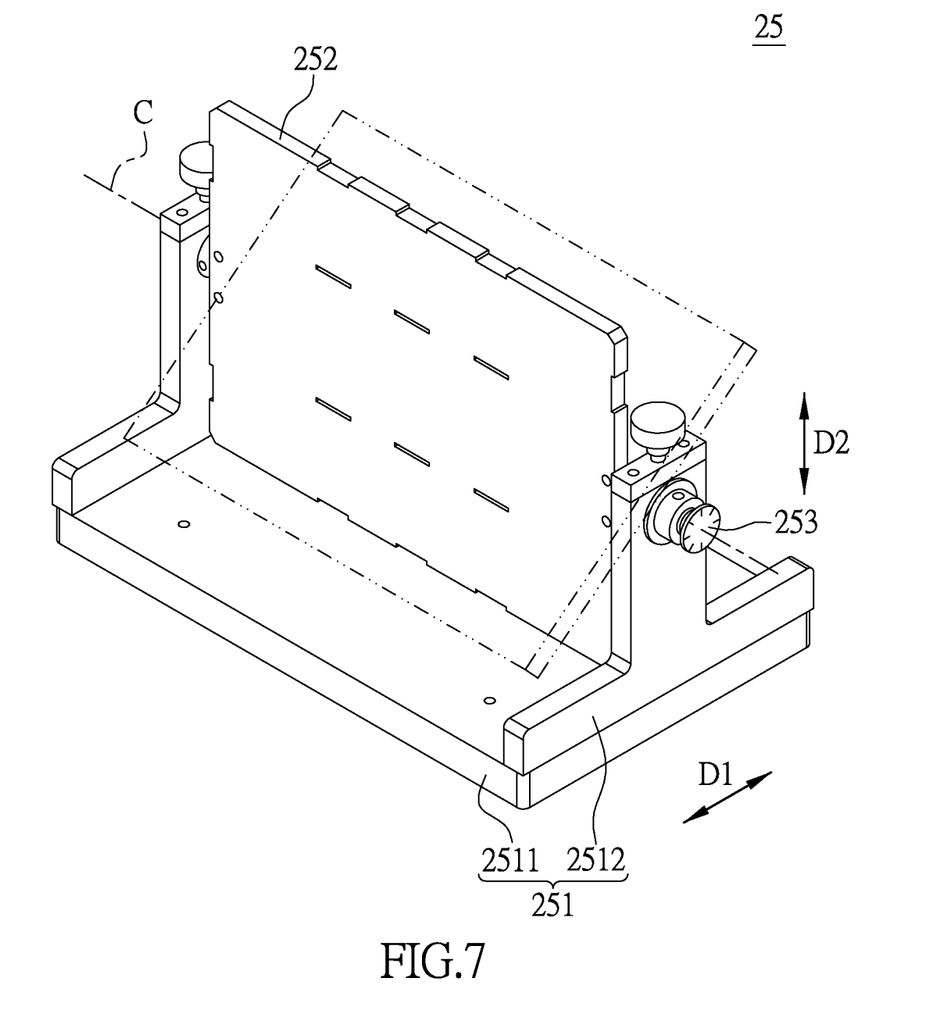
FIG. 7 is a perspective view showing the angle-adjusting seat.

Please refer to FIGS. 3 and 7. The angle-adjusting seat 25 has a frame 251, a rotating plate 252 rotatably disposed on the frame 251, and an angle-measuring element 253. The frame 251 has a mounting plate 2511 and two T-shaped pivoting plates 2512 respectively disposed on two opposite ends of the mounting plate 2511 (i.e., the front end and the rear end of the mounting plate 2511 as shown in FIG. 7). The frame 251 is detachably installed on the carrying plate 22.

The rotating plate 252 is substantially a rectangular plate. Two opposite edges of the rotating plate 252 are respectively pivoted with respect to the end portions of the pivoting plates 2512 that are distal to the mounting plate 2511 (i.e., the top portions of the pivoting plates 2512 as shown in FIG. 7), so that the mounting plate 252 can rotate along a rotating axis C. The rotating axis C is perpendicular to the displacing direction D1 and is perpendicular to the lifting direction D2.

Thus, the untested antenna 200 can be mounted on the rotating plate 252 (as shown in FIG. 8), and the rotating plate 252 is rotatable with respect to the frame 251 so that a titled angle of the rotating plate 252 (or a titled angle of the untested antenna 200) can be adjusted. Moreover, the angle-measuring element 253 is arranged on the rotating axis C to immediately display the titled angle of the rotating plate 252 (or the titled angle of the untested antenna 200).

Please refer to FIG. 1 through FIG. 3. The displacement-measuring member 3 in the instant embodiment is an elongated ruler for example, and number of the displacement-measuring member 3 is two. The displacement-measuring members 3 are movably disposed on the track platform 11 and are parallel to the displacing direction D1. The displacement-measuring members 3 are arranged at two opposite outer sides of the track module 12 (i.e., the front side and the rear side of the track module 12 as shown in FIG. 1)

Each displacement-measuring member 3 has a zero point 31 and a distance scale 32 counting from the zero point 31 along the displacing direction D1, and the distance scales 32 of the two displacement-measuring members 3 count respectively in two opposite directions (i.e., in FIG. 1, the distance scale 32 of the front displacement-measuring member 3 counts leftward from the corresponding zero point 31, and the distance scale 32 of the rear displacement-measuring member 3 counts rightward from the corresponding zero point 31). Moreover, each displacement-measuring member 3 is adjustable in order to align the zero point 31 to the scale indicator 2111 of the antenna carrying device 2.

The above description is the construction of the holder 100, and then the operating manner of the holder 100 is disclosed thereafter.

Please refer to FIGS. 8 and 9. The untested antenna 200 is disposed on the rotating plate 252 of the angle-adjusting seat 25, and the untested antenna 200 is adjusted to a predetermined titled angle by rotating the rotating plate 252. When the rotating plate 252 is rotated, the angle-measuring element 253 shows the titled angle of the rotating plate 252 immediately, thereby quickly and precisely adjusting the titled angle of the untested antenna 200. Besides, the angle-adjusting seat 25 can be detached from the carrying plate 22, and the untested antenna 200 can be directly disposed on the carrying plate 22.

Moreover, the holder 100 can adjust the height of the carrying plate 22 by the height-adjusting shaft 214 so as to arrange the untested antenna 200 at a predetermined height. During the height adjustment of the carrying plate 22, the height-measuring element 23 shows the height of the carrying plate 22 immediately, thereby quickly and precisely adjusting the height of the untested antenna 200.

The antenna carrying device 2 can be adjusted to any position of the track base 1 by coordinating the track module 12 and the antenna carrying device 2. The following description discloses the features about the antenna carrying device 2 moving along the track module 12 in order to adjust the position.

When the antenna carrying device 2 moves from the first position (as shown in FIG. 8) to the second position (as shown in FIG. 9), the zero point 31 of the displacement-measuring member 3 aligns with the scale indicator 2111 of the antenna carrying device 2 arranged at the first position, so that the distance scale 32 immediately shows a moving distance of the antenna carrying device 2 with respect to the track base 1 displacement-measuring member. In addition, after the moving distance is displayed, the displacement-measuring member 3 is adjustable to align the zero point 31 to the scale indicator 2111 of the antenna carrying device 2 that is arranged at the second position (as shown in FIG. 9), such that when the antenna carrying device 2 moves from the second position, the distance scale 32 can immediately show a moving distance of the antenna carrying device 2 with respect to the track base 1.

Based on the description above, the holder 100 has the movable displacement-measuring member 3 that can adjust and align the zero point 31 of the displacement-measuring member 3 with the scale indicator 2111 of the antenna carrying device 2 before the antenna carrying device 2 is moved, thus when the antenna carrying device 2 is moved, the distance scale 32 can immediately show a moving distance of the antenna carrying device 2 with respect to the track base 1. Successively, quick and precise measurements can be provided as well as reduction in the testing time of the antenna.

Figure 10:
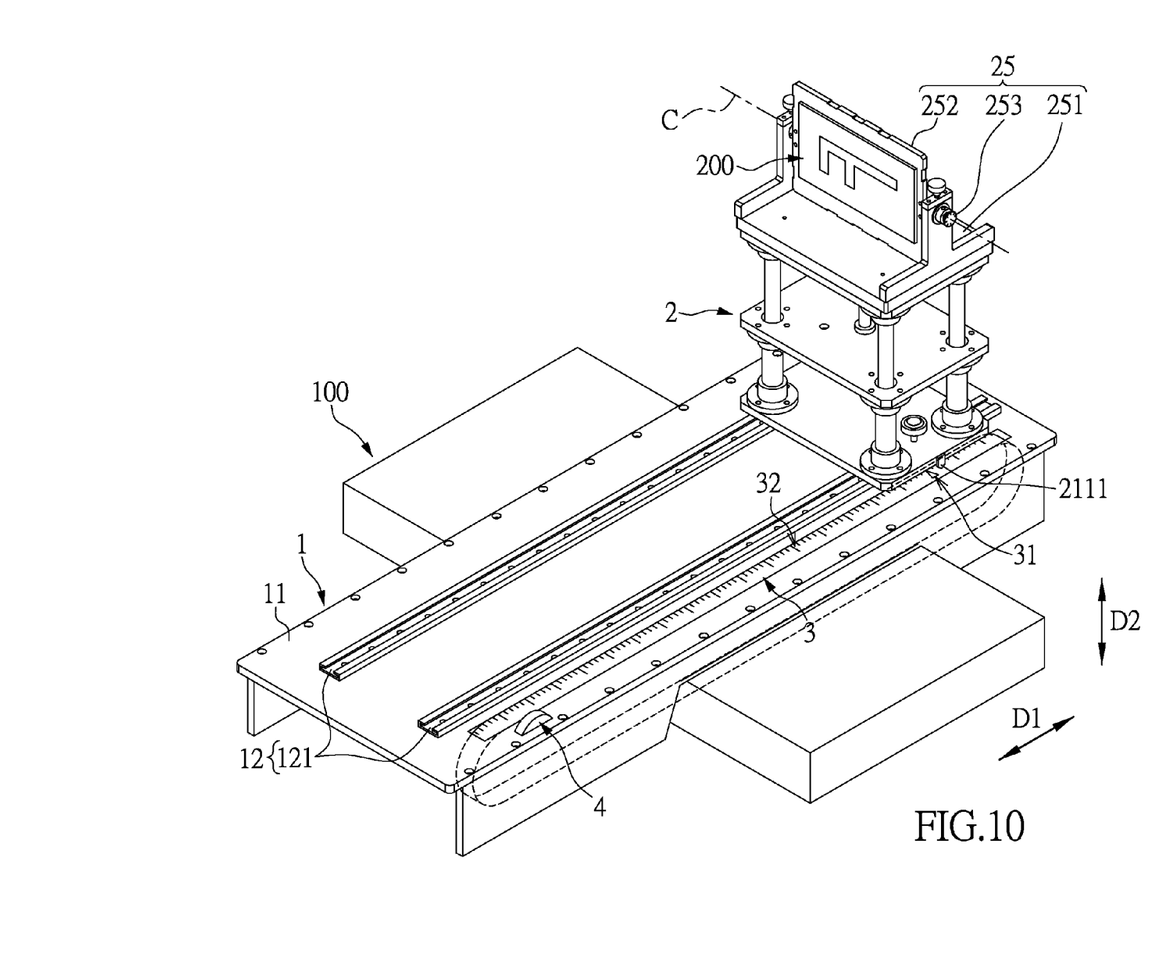
FIG. 10 is a perspective view showing the holder mounting an untested antenna when the holder is at the first position according to another embodiment of the instant disclosure.
Figure 11:
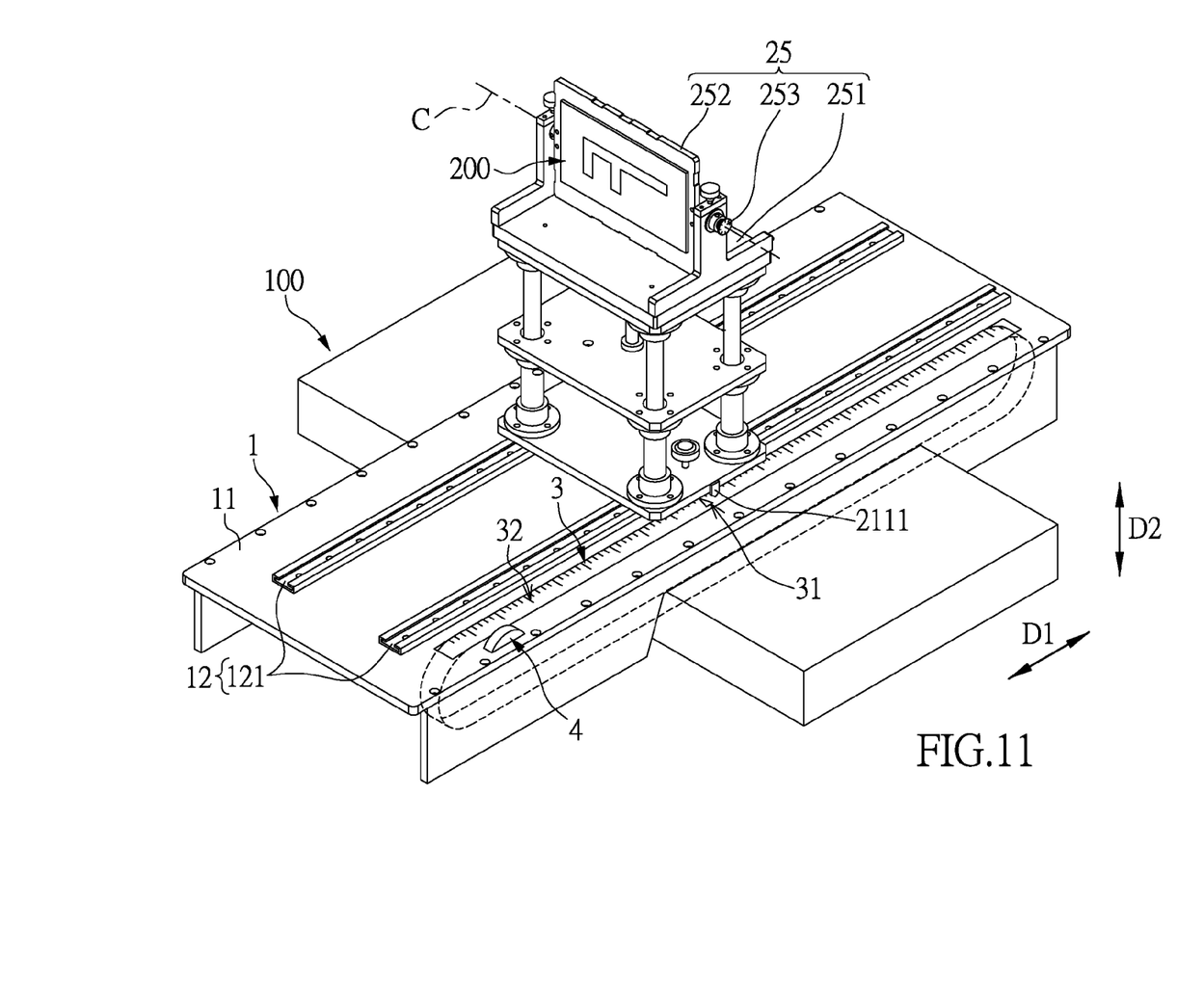
FIG. 11 is a perspective view showing the holder mounting the untested antenna when the holder is at the second position according to another embodiment of the instant disclosure.

Another embodiment of the instant disclosure is shown in FIGS. 10 and 11. The instant embodiment is similar to the previous embodiment, so the identical features are not disclosed again. The main difference between the two embodiments is the construction of the displacement-measuring member 3.

Specifically, the displacement-measuring member 3 in the instant embodiment is a ring-shaped ruler. The displacement-measuring member 3 is rotatably arranged in the track platform 11 and is disposed outside the track module 12 (i.e., the front side of the track module 12 as shown in FIG. 10). The displacement-measuring member 3 has a zero point 31 and a distance scale 32 counting both leftward and rightward from the zero point 31 along the displacing direction D1. The zero point 31 and part of the distance scale 32 are exposed from the track platform 11, and the displacement-measuring member 3 is rotatable so that the zero point 31 can be aligned to the scale indicator 2111 of the antenna carrying device 2.

Moreover, the holder 100 in the instant embodiment has an adjusting member 4 (i.e., disk) installed on the track platform 11, and part of the adjusting member 4 is exposed from the track platform 11 for user operation. The adjusting member 4 connects the displacement-measuring member 3, so that the zero point 31 can be aligned to the scale indicator 2111 of the antenna carrying device 2 by operating the adjusting member 4 which in turn rotates the displacement-measuring member 3.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A holder for antenna testing, comprising:
    a track base having a track platform and a track module disposed on the track platform, wherein a longitudinal direction of the track module defines a displacing direction;
    an antenna carrying device movably disposed on the track module along the displacing direction, wherein the antenna carrying device is movable with respect to the track module from a first position to a second position along the displacing direction, wherein the antenna carrying device comprises:
        a bottom seat movably disposed on the track platform along the displacing direction;
        a carrying plate movably disposed on the bottom seat along a lifting direction perpendicular to the displacing direction; and
        a height-measuring element fixed on the carrying plate and parallel to the lifting direction, wherein when the carrying plate moves with respect to the track platform along the lifting direction, the height-measuring element displays a lifting distance of the carrying plate with respect to the track platform; and
    at least one displacement-measuring member movably disposed on the track platform along the displacing direction and arranged outside the track module, wherein the displacement-measuring member has a zero point and a distance scale counting from the zero point along the displacing direction, the displacement-measuring member is adjustable to align the zero point to the antenna carrying device;
    wherein when the antenna carrying device moves from the first position to the second position, the distance scale displays a moving distance of the antenna carrying device with respect to the track base by aligning the zero point of the displacement-measuring member with the antenna carrying device arranged at the first position; the displacement-measuring member is adjustable to align the zero point to the antenna carrying device arranged at the second position after the moving distance is displayed, wherein the height-measuring element has a zero point and a distance scale counting from the zero point along the lifting direction, the zero point of the height-measuring element is fixed on the carrying plate; the antenna carrying device further comprising a scale indicator arranged adjacent to the height-measuring element, the scale indicator aligns with a point of the distance scale of the height-measuring element, and the point of the distance scale of the height-measuring element displays the lifting distance of the carrying plate with respect to the track platform, wherein the height-measuring element is arranged in a region, the region is defined by the orthogonal projection of the carrying plate to the track base, the bottom seat has a thru-hole, and the height-measuring element movably passes through the thru-hole of the bottom seat, the scale indicator is arranged adjacent to the thru-hole of the bottom seat.

2. The holder as claimed in claim 1, wherein the bottom seat has a lower plate, an upper plate, and a plurality of retractable units, each retractable unit has a hollow supporting shaft and an extendable shaft at least partially inserted into the supporting shaft, wherein each supporting shaft has two opposite ends respectively fixed on the lower plate and the upper plate, a top portion of each extendable shaft passing through the upper plate is fixed on the carrying plate, and each extendable shaft is movable with respect to the corresponding supporting shaft along the lifting direction.

3. The holder as claimed in claim 1, wherein the antenna carrying device comprises:
an angle-adjusting seat having a frame and a rotating plate rotatably disposed on the frame, wherein the frame is detachably disposed on the carrying plate for mounting an untested antenna, and the rotating plate is rotatable with respect to the frame for adjusting a titled angle of the rotating plate.

4. The holder as claimed in claim 3, wherein the rotating plate is rotatable about a rotating axis perpendicular to the displacing direction, the angle-adjusting seat has an angle-measuring element arranged along the rotating axis for displaying the titled angle of the rotating plate.

5. The holder as claimed in claim 1, wherein the number of the displacement-measuring member is two, and the two distance scales of the two displacement-measuring members count from the zero point in two opposite directions.

6. A holder for antenna testing, comprising:
a track base having a track platform and a track module disposed on the track platform, wherein a longitudinal direction of the track module defines a displacing direction;
an antenna carrying device movably disposed on the track module along the displacing direction, wherein the antenna carrying device is movable with respect to the track module from a first position to a second position along the displacing direction, wherein the antenna carrying device comprises:
a bottom seat movably disposed on the track platform along the displacing direction;
a carrying plate movably disposed on the bottom seat along a lifting direction perpendicular to the displacing direction; and a height-measuring element fixed on the carrying plate and parallel to the lifting direction, wherein when the carrying plate moves with respect to the track platform along the lifting direction, the height-measuring element displays a lifting distance of the carrying plate with respect to the track platform; and at least one displacement-measuring member movably disposed on the track platform along the displacing direction and arranged outside the track module, wherein the displacement-measuring member has a zero point and a distance scale counting from the zero point along the displacing direction, the displacement-measuring member is adjustable to align the zero point to the antenna carrying device;

wherein when the antenna carrying device moves from the first position to the second position, the distance scale displays a moving distance of the antenna carrying device with respect to the track base by aligning the zero point of the displacement-measuring member with the antenna carrying device arranged at the first position; the displacement-measuring member is adjustable to align the zero point to the antenna carrying device arranged at the second position after the moving distance is displayed, wherein the height-measuring element has a zero point and a distance scale counting from the zero point along the lifting direction, the zero point of the height-measuring element is fixed on the carrying plate; the antenna carrying device further comprising a scale indicator arranged adjacent to the height-measuring element, the scale indicator aligns with a point of the distance scale of the height-measuring element, and the point of the distance scale of the height-measuring element displays the lifting distance of the carrying plate with respect to the track platform, wherein the bottom seat has a lower plate, an upper plate, and a plurality of retractable units, each retractable unit has a hollow supporting shaft and an extendable shaft at least partially inserted into the supporting shaft, wherein each supporting shaft has two opposite ends respectively fixed on the lower plate and the upper plate, a top portion of each extendable shaft passing through the upper plate is fixed on the carrying plate, and each extendable shaft is movable with respect to the corresponding supporting shaft along the lifting direction.

7. A holder for antenna testing, comprising:
a track base having a track platform and a track module disposed on the track platform, wherein a longitudinal direction of the track module defines a displacing direction;
an antenna carrying device movably disposed on the track module along the displacing direction, wherein the antenna carrying device is movable with respect to the track module from a first position to a second position along the displacing direction, wherein the antenna carrying device comprises:
a bottom seat movably disposed on the track platform along the displacing direction;
a carrying plate movably disposed on the bottom seat along a lifting direction perpendicular to the displacing direction; and
an angle-adjusting seat having a frame and a rotating plate rotatably disposed on the frame, wherein the frame is detachably disposed on the carrying plate for mounting an untested antenna, and the rotating plate is rotatable with respect to the frame for adjusting a titled angle of the rotating plate; and at least one displacement-measuring member movably disposed on the track platform along the displacing direction and arranged outside the track module, wherein the displacement-measuring member has a zero point and a distance scale counting from the zero point along the displacing direction, the displacement-measuring member is adjustable to align the zero point to the antenna carrying device;

wherein when the antenna carrying device moves from the first position to the second position, the distance scale displays a moving distance of the antenna carrying device with respect to the track base by aligning the zero point of the displacement-measuring member with the antenna carrying device arranged at the first position; the displacement-measuring member is adjustable to align the zero point to the antenna carrying device arranged at the second position after the moving distance is displayed, wherein the rotating plate is rotatable about a rotating axis perpendicular to the displacing direction, the angle-adjusting seat has an angle-measuring element arranged along the rotating axis for displaying the titled angle of the rotating plate.

* * * * *